United States Patent
Zhu et al.

(10) Patent No.: US 12,238,919 B2
(45) Date of Patent: Feb. 25, 2025

(54) SEMICONDUCTOR STRUCTURE AND SEMICONDUCTOR STRUCTURE MANUFACTURING METHOD

(71) Applicant: CHANGXIN MEMORY TECHNOLOGIES, INC., Hefei (CN)

(72) Inventors: Yuhan Zhu, Hefei (CN); Chuxian Liao, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 581 days.

(21) Appl. No.: 17/456,091

(22) Filed: Nov. 22, 2021

(65) Prior Publication Data
US 2022/0085027 A1 Mar. 17, 2022

Related U.S. Application Data

(63) Continuation of application No. PCT/CN2021/106888, filed on Jul. 16, 2021.

(30) Foreign Application Priority Data

Sep. 14, 2020 (CN) .......................... 202010963391.2

(51) Int. Cl.
H01L 23/528 (2006.01)
H10B 12/00 (2023.01)
(52) U.S. Cl.
CPC ......... H10B 12/315 (2023.02); H10B 12/482 (2023.02)
(58) Field of Classification Search
CPC .. H10B 12/315; H10B 12/482; H10B 12/033; H10B 12/036; H10B 12/488; H10B 12/33
See application file for complete search history.

(56) References Cited

U.S. PATENT DOCUMENTS 5,525,820 A * 6/1996 Furuyama ............. G11C 11/404
365/182
6,515,888 B2 2/2003 Johnson
(Continued)

FOREIGN PATENT DOCUMENTS

| CN | 1248065 A | 3/2000 |
| CN | 102428562 A | 4/2012 |

(Continued)

OTHER PUBLICATIONS

United States Patent and Trademark office, Non-final office action issued in U.S. Appl. No. 17/651,108 on Jun. 7, 2024.
(Continued)

*Primary Examiner* — Samuel Park
(74) *Attorney, Agent, or Firm* — Kilpatrick Townsend & Stockton LLP

(57) ABSTRACT

A semiconductor structure and a semiconductor structure manufacturing method is provided. The semiconductor structure includes: a wordline; and a first bitline and a second bitline located on two sides of the wordline and a first storage structure and a second storage structure located on the two sides of the wordline, the first bitline and the second bitline being connected to the first storage structure and the second storage structure respectively through a transistor. An extension direction of the first bitline and an extension direction of the wordline are at an acute or obtuse angle. In this way, the first storage structure and the second storage structure are provided on both sides of the wordline, which can increase storage capacity.

12 Claims, 14 Drawing Sheets

(56) References Cited

U.S. PATENT DOCUMENTS

| | | |
|---|---|---|
| 7,084,029 B2 | 8/2006 | Kundalgurki |
| 7,763,924 B2 | 7/2010 | Huang |
| 8,274,110 B2 | 9/2012 | Sandhu |
| 8,723,252 B2 | 5/2014 | Sandhu |
| 10,020,360 B1 | 7/2018 | Ramaswamy |
| 10,622,366 B2 | 4/2020 | Chavan et al. |
| 10,818,729 B2 | 10/2020 | Lung |
| 10,867,675 B2 | 12/2020 | Derner et al. |
| 2002/0075719 A1 | 6/2002 | Johnson |
| 2009/0289251 A1* | 11/2009 | Kiyotoshi .............. H10B 63/20 257/43 |
| 2010/0295120 A1 | 11/2010 | Sandhu |
| 2012/0326242 A1 | 12/2012 | Sandhu |
| 2013/0099305 A1* | 4/2013 | Kim .................... H10B 12/053 257/329 |
| 2019/0067183 A1* | 2/2019 | Liu ....................... H01L 23/528 |
| 2019/0206869 A1 | 7/2019 | Kim et al. |
| 2019/0355790 A1 | 11/2019 | Lung et al. |
| 2021/0183861 A1 | 6/2021 | Lee et al. |
| 2022/0044725 A1* | 2/2022 | Park .................... H10B 12/315 |

FOREIGN PATENT DOCUMENTS

| | | | |
|---|---|---|---|
| CN | 109427787 A | | 3/2019 |
| CN | 110168726 A | | 8/2019 |
| CN | 110168727 A | | 8/2019 |
| CN | 110504271 A | | 11/2019 |
| CN | 110914983 A | | 3/2020 |
| CN | 210640252 U | | 5/2020 |
| KR | 20220019498 A | * | 8/2020 |

OTHER PUBLICATIONS

International Search Report as cited in PCT Application No. PCT/CN2021/106888 mailed Oct. 22, 2021, 4 pages.
International Search Report and Written Opinion as cited in PCT/CN2021/110882, mailed Oct. 14, 2021, 5 pages.
Written Opinion cited in PCT/CN2021/110882, mailed Oct. 14, 2021, 6 pages.
Written Opinion cited in PCT/CN2021/106888, mailed on Oct. 22, 2021, 7 pages.

* cited by examiner

SEMICONDUCTOR STRUCTURE AND SEMICONDUCTOR STRUCTURE MANUFACTURING METHOD

CROSS-REFERENCE TO RELATED APPLICATIONS

This application is a continuation application of International Patent Application No. PCT/CN2021/106888, filed on Jul. 16, 2021, which claims priority to Chinese Patent Application No. 202010963391.2, filed with the Chinese Patent Office on Sep. 14, 2020 and entitled "SEMICONDUCTOR STRUCTURE AND SEMICONDUCTOR STRUCTURE MANUFACTURING METHOD." International Patent Application No. PCT/CN2021/106888 and Chinese Patent Application No. 202010963391.2 are incorporated herein by reference in their entireties.

TECHNICAL FIELD

Embodiments of the present disclosure relate to the field of semiconductors, and in particular, to a semiconductor structure and a semiconductor structure manufacturing method.

BACKGROUND

A memory in a semiconductor structure is a memory component configured to store data information, and a random access memory is divided into a static random access memory and a dynamic random access memory. The dynamic random access memory generally includes a capacitor and a transistor connected to the capacitor. The capacitor is configured to store charges representing stored information. The transistor is a switch that controls the charges of the capacitor to flow in and out. When data is written, a wordline provides a high level, the transistor is turned on, and the capacitor is charged through a bitline. When the data is read, the wordline also provides a high level, the transistor is turned on, the capacitor discharges, and the bitline receives a read signal.

However, with the continuous development of a memory technology, it is increasingly difficult to increase storage capacity by reducing a size of a memory.

SUMMARY

According to some embodiments, in a first aspect, the present disclosure provides a semiconductor structure, including: a wordline; and a first bitline and a second bitline located on two sides of the wordline and a first storage structure and a second storage structure located on the two sides of the wordline, the first bitline and the second bitline being connected to the first storage structure and the second storage structure respectively through a transistor. An extension direction of the first bitline and an extension direction of the wordline are at an acute or obtuse angle.

According to some embodiments, in a second aspect, the present disclosure further provides a semiconductor structure manufacturing method, including: providing a substrate, and forming a first storage structure on the substrate; forming a second bitline on the first storage structure; forming a transistor and a wordline on the second bitline, the transistor including a source, a drain and a channel region, the channel region of the transistor being connected to the wordline; forming a first bitline on the transistor and the wordline; and forming a second storage structure on the first bitline, wherein the first bitline and the second bitline are connected to the first storage structure and the second storage structure respectively through the transistor; and an extension direction of the first bitline and an extension direction of the wordline being at an acute or obtuse angle.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DETAILED DESCRIPTION

The embodiments of the present disclosure provide a semiconductor structure and a semiconductor structure manufacturing method. The semiconductor structure has a first storage structure and a second storage structure located on two sides of a wordline and a first bitline and a second bitline located on the two sides of the wordline, and extension directions of the first bitline and the second bitline are the same. The extension direction of the first bitline and an extension direction of the wordline are at an acute or obtuse angle. Therefore, a process window can be improved and a product yield can be increased while storage capacity is increased.

In order to make the objectives, technical solutions and advantages of the embodiments of the present disclosure clearer, various embodiments of the present disclosure will be described below in details with reference to the drawings. However, those of ordinary skill in the art may understand that, in the embodiments of the present disclosure, numerous technical details are set forth in order to enable a reader to better understand the present disclosure. However, the technical solutions claimed in the present disclosure can be implemented without these technical details and various changes and modifications based on the embodiments below.

Figure 1:
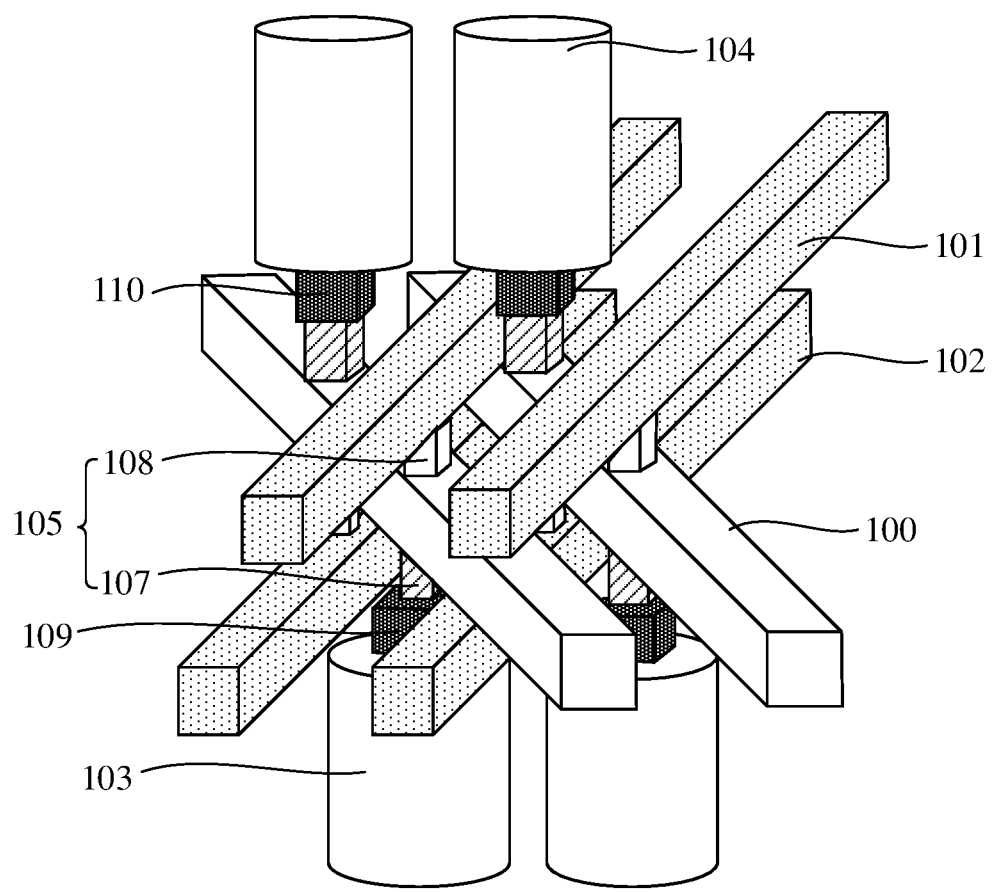
FIG. 1 is a schematic diagram of a semiconductor structure according to a first embodiment of the present disclosure.

A first embodiment of the present disclosure provides a semiconductor structure. FIG. 1 is a schematic diagram of a semiconductor structure according to this embodiment.

Referring to FIG. 1, the semiconductor structure includes: a wordline 100; and a first bitline 101 and a second bitline 102 located on two sides of the wordline 100 and a first storage structure 103 and a second storage structure 104 located on the two sides of the wordline. The first bitline 101 and the second bitline 102 are connected to the first storage structure 103 and the second storage structure 104 respectively through a transistor 105. An extension direction of the first bitline 101 and an extension direction of the wordline 100 are at an acute or obtuse angle.

The semiconductor structure according to the embodiment of the present disclosure has a first storage structure 103 and a second storage structure 104 located on two sides of the transistor 105 respectively, and a first bitline 101 and a second bitline 102 located on the two sides of the transistor 105 respectively. Compared with a memory of a monolayer structure, an internal space of the memory according to this embodiment is more fully utilized, so as to increase the storage capacity and improve the performance of the memory. In addition, when an extension direction of the wordline and an extension direction of the first bitline 101 are at an acute or obtuse angle, a spacing between the first storage structures on a same side of the wordline can be increased, so as to improve a process window and increase a product yield.

A detailed description is provided below with reference to the accompanying drawings.

Referring to FIG. 1, the transistor 105 is a vertical transistor, a middle of the transistor 105 is coated with the wordline 100, and the wordline 100 is connected to a channel region (not shown in the drawing) of the transistor 105 and configured to control ON and OFF of the transistor 105.

A source 107 and a drain 108 are at two ends of the transistor 105.

The transistor 105 includes a first transistor and a second transistor, two ends of the first transistor are connected to the first bitline 101 and the first storage structure 103 respectively, and two ends of the second transistor are connected to the second bitline 102 and the second storage structure 104 respectively.

In this embodiment, the source 107 of the first transistor is connected to the first storage structure 103, and the drain 108 of the first transistor is connected to the first bitline 101. The source 107 of the second transistor is connected to the second storage structure 104, and the drain 108 of the second transistor is connected to the second bitline 102.

In other embodiments, the drain 108 of the first transistor may also be connected to the first storage structure 103, and the source 107 of the first transistor is connected to the first bitline 101. The drain 108 of the second transistor may also be connected to the second storage structure 104, and the source 107 of the second transistor is connected to the second bitline 102.

The first bitline 101 and the second storage structure 104 are located on one side of the transistor 105, and the second bitline 102 and the first storage structure 103 are located on the other side of the transistor 105.

The first storage structure 103 and the second storage structure 104 are located on two sides of the transistor 105, which can increase a number of the storage structures, thereby obtaining greater storage capacity.

In some embodiments, adjacent transistors connected to a same wordline are connected to the first storage structure 103 and the second storage structure 104 respectively, so as to increase a number of the storage structures connected to the same wordline and then increase the storage capacity.

In this embodiment, the second bitline 102 and the first storage structure 103 are located on different layers, and the first bitline 101 and the second storage structure 104 are located on different layers; and the second bitline 102 is closer to one layer of the transistor 105 than the first storage structure 103. The first bitline 101 is closer to one layer of the transistor 105 than the second storage structure 104. In other embodiments, the second storage structure 104 may be closer to one layer of the transistor 105 than the first bitline 101, and the first storage structure 103 may be closer to one layer of the transistor 105 than the second bitline 102.

In some embodiments, a first storage node contact 109 and the second bitline 102 are located on a same layer, and a second storage node contact 110 and the first bitline 101 are located on a same layer, so as to further save the internal space of the memory and reduce the size of the memory.

In this embodiment, adjacent transistors 105 connected to a same wordline 100 are connected to the first storage structure 103 and the second storage structure 104 respectively.

For example, a plurality of wordlines 100 are located in a same layer, a plurality of first bitlines 101 and a plurality of second storage structures 104 are located on one side of the layer where the wordlines 100 are located, and a plurality of second bitlines 102 and a plurality of first storage structures 103 are located on the other side of the layer where the wordlines 100 are located; and the plurality of first bitlines 101 are located in a same layer, the plurality of second storage structures 104 are located in a same layer, the plurality of second bitlines 102 are located in a same layer, and the plurality of first storage structures 103 are located in a same layer. The same wordline 100 is connected to a plurality of transistors 105; that is, the same wordline 100 corresponds to the first storage structure 103 and the second storage structure 104. Correspondingly, the same wordline 100 corresponds to the first bitline 101 and the second bitline 102. The same wordline 100 corresponds to two layers of storage structures and wordlines, which can increase a number of the storage structures connected to the wordline 100 and then increase storage capacity of the memory.

In some embodiments, the transistor 105 connected to the first storage structure 103 and the transistor 105 connected to the second storage structure 104 are staggered. Therefore, the first storage structure 103 and the second storage structure 104 corresponding to the same wordline 100 are more densely arranged, and the internal space of the memory is more efficiently utilized.

In some embodiments, the transistors 105 connected to the first storage structures 103 are aligned, and the transistors 105 connected to the second storage structures 104 are aligned. For example, the transistors 105 connected to the first storage structures 103 are arranged in a square, and the transistors 105 connected to the second storage structures 104 are also arranged in a square. The transistors 105 connected to the first storage structures 103 are located on a central axis of the square formed by the transistors 105 connected to the second storage structures 104, and the transistors 105 connected to the second storage structures 104 are located on a central axis of the square formed by the transistors connected to the first storage structures 103, so as to increase an arrangement density of the transistors 105 and the storage structures.

In some embodiments, during reading and writing, a distance between the first storage structure 103 and the second storage structure 104 correspondingly connected to any adjacent transistors 105 controlled on the same wordline 100 is larger since the storage structures connected to the two adjacent transistors 105 are located on upper and lower sides, which are more difficult to be disturbed by a parasitic effect. In other embodiments, the transistor 105 connected to the first storage structure 103 and the transistor 105 connected to the second storage structure 104 may not be staggered; that is, a plurality of transistors connected to the first storage structures are arranged adjacently or a plurality of transistors connected to the second storage structures are arranged adjacently.

Understandably, in other embodiments, the transistors connected to the same wordline are connected to one of the first storage structures and the second storage structures; that is, the same wordline corresponds to only the first storage structures or only the second storage structures. Correspondingly, the same wordline corresponds to only the first bitlines or only the second bitlines.

In some embodiments, the wordlines corresponding to the first storage structures are arranged alternately with the wordlines corresponding to the second storage structures.

In this embodiment, orthographic projections of the first storage structure 103 and the second storage structure 104 on a plane where the wordlines 100 are arranged are staggered with or separated from each other to further increase the arrangement density.

An extension direction of the wordline 100 and an extension direction of the first bitline 101 are at an acute or obtuse angle. That is, the extension direction of the wordline 100 is not perpendicular to the extension direction of the first bitline 101. When the extension directions of the first bitline 101 and the wordline 100 are at an acute or obtuse angle and a distance between the wordlines 100 is fixed, a spacing between the first storage structures 103 on a same side of the wordline 100 may be increased, thereby improving a process window and increasing a product yield.

In some embodiments, extension directions of the first bitline 101 and the second bitline 102 are the same, which can simplify design difficulty of the semiconductor structure. At the same time, when the distance between the wordlines 100 is fixed and extension directions of the second bitline102 and the wordline 100 are at an acute or obtuse angle, a spacing between the second storage structures 104 on the other side of the wordline 100 may be increased, thereby improving the process window and increasing the product yield.

In some embodiments, the extension direction of the first bitline 101, the extension direction of the second bitline 102 and the extension direction of the wordline 100 are at an angle of 60 degrees to each other. Overlapping regions between the first bitline 101, the second bitline 102 and the wordline 100 are reduced as much as possible to reduce mutual coupling between the three.

The semiconductor structure according to this embodiment further includes: a first storage node contact 109 and a second storage node contact 110. The first storage structure 103 is connected to a source 107 or a drain 108 of the transistor 105 through the first storage node contact 109, and the second storage structure 104 is connected to the source 107 or the drain 108 of the transistor 105 through the second storage node contact 110.

In this embodiment, the first storage node contact 109 and the second bitline 102 are on a same layer, and the second storage node contact 110 and the first bitline 101 are on a same layer. In this way, the internal space of the memory can be further fully utilized, and a volume of the memory is reduced. In other embodiments, the first storage node contact may not be on a same layer as the second bitline, and the second storage node contact may not be on a same layer as the first bitline.

The semiconductor structure according to this embodiment further includes: a first bitline node contact (not shown in the drawing) and a second bitline node contact (not shown in the drawing). The first bitline 101 is connected to the source 107 or the drain 108 of the transistor 105 through the first bitline node contact, and the second bitline 102 is connected to the source 107 or the drain 108 of the transistor 105 through the second bitline node contact.

In this embodiment, the source 107 and the drain 108 of the transistor 105 are made of an N-type semiconductor material or a P-type semiconductor material.

The wordline 100 is made of tantalum, tungsten, tantalum nitride, titanium nitride or other low-resistance metals.

The first bitline 101 includes structures such as a conductive layer, an insulation layer and a bitline contact layer. The conductive layer is made of a conductive material such as tantalum, tungsten, tantalum nitride or titanium nitride. The bitline contact layer is made of a conductive material such as polysilicon. The insulation layer is made of an insulation material such as silicon nitride or silicon carbonitride.

The second bitline 102 includes structures such as a conductive layer, an insulation layer and a bitline contact layer. The conductive layer is made of a conductive material such as tantalum, tungsten, tantalum nitride or titanium nitride. The bitline contact layer is made of a conductive material such as polysilicon. The insulation layer is made of an insulation material such as silicon nitride or silicon carbonitride.

In this embodiment, the first bitline 101 and the second bitline 102 are the same in structure and material. In other embodiments, the first bitline and the second bitline may also be different in structure and material.

The first storage structure 103 may be a capacitive storage structure, a magnetic storage structure, a resistive storage structure, a ferroelectric storage structure or the like.

The second storage structure 104 may be a capacitive storage structure, a magnetic storage structure, a resistive storage structure, a ferroelectric storage structure or the like.

In this embodiment, the first storage structure 103 and the second storage structure 104 are the same. In other embodiments, the first storage structure and the second storage structure may also be different.

The first storage node contact 109 is made of a conductive material, such as polysilicon or silicon germanium.

The second storage node contact 110 is made of a conductive material, such as polysilicon or silicon germanium.

In this embodiment, the first storage node contact 109 and the second storage node contact 110 are the same in material. In other embodiments, the first storage node contact and the second storage node contact may also be different in material.

The first bitline node contact is made of a conductive material, such as polysilicon or silicon germanium.

The second bitline node contact is made of a conductive material, such as polysilicon or silicon germanium.

In this embodiment, the first bitline node contact and the second bitline node contact are the same in material. In other embodiments, the first bitline node contact and the second bitline node contact may also be different in material.

Based on the above, the semiconductor structure according to this embodiment has the first storage structure 103 and the second storage structure 104 located on two sides of the wordline 100 respectively and the first bitline 101 and the second bitline 102 located on the two sides of the wordline 100 respectively; and the wordline 100 corresponding to the first storage structure 103 and the wordline 100 corresponding to the second storage structure 104 are arranged alternately; and the extension direction of the wordline 100 and the extension directions of the first bitline 101 and the second bitline 102 are at an acute or obtuse angle. In this way, the internal space of the memory can be fully utilized, and then the storage capacity is increased. The spacing between the wordlines 100 is fixed, which can increase spacings between the first storage structures 103 and between the second storage structures 104, thereby improving the process window and increasing the product yield.

A second embodiment of the present disclosure provides a semiconductor structure manufacturing method. The manufacturing method may be used to manufacture the semiconductor structure in the first embodiment. FIG. 2 to FIG. 28 are schematic structural diagrams corresponding to steps of the method. A detailed description is provided below with reference to the accompanying drawings.

Figure 2:
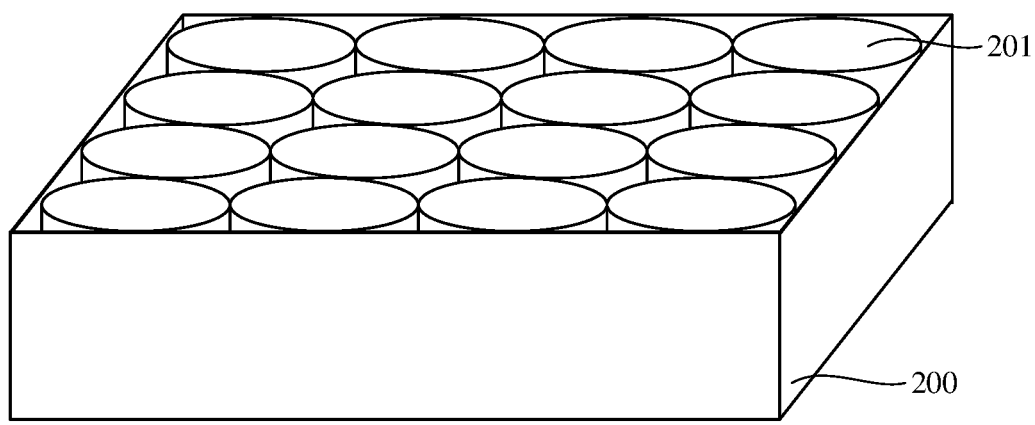
FIG. 2 to FIG. 28 are schematic structural diagrams corresponding to steps of a semiconductor structure manufacturing method according to a second embodiment of the present disclosure.
Figure 3:
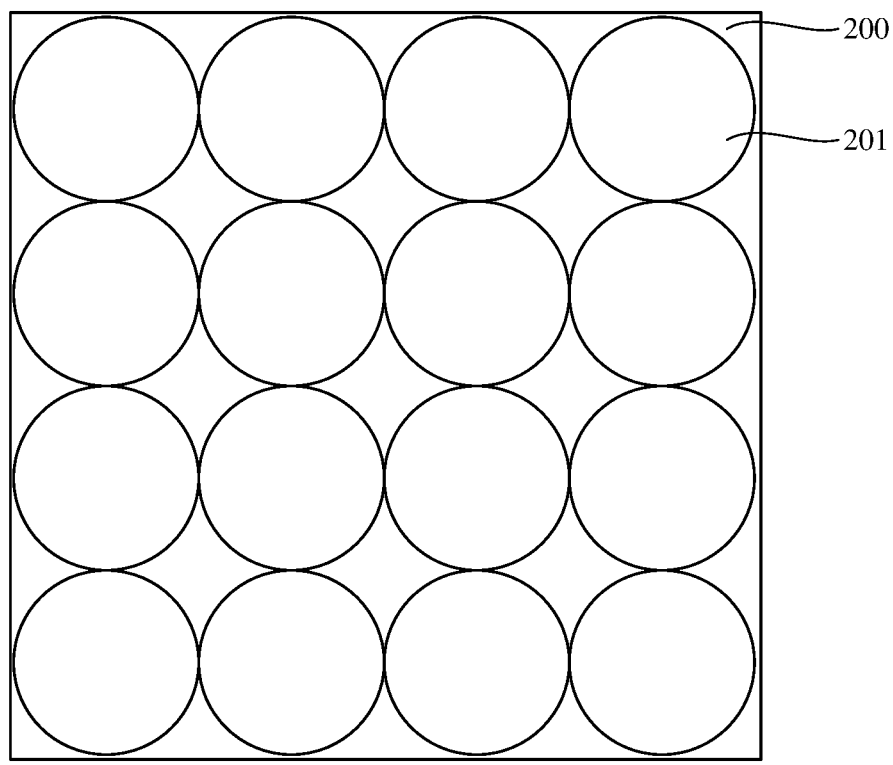

Referring to FIG. 2 and FIG. 3, FIG. 3 is a top view of the semiconductor structure of FIG. 2. A substrate 200 is provided, and a first storage structure 201 is formed on the substrate 200.

The substrate 200 may be made of an insulation material, such as silicon oxide or silicon nitride. The substrate 200 may also be made of a semiconductor material, such as monocrystalline silicon, gallium nitride or gallium arsenide.

The first storage structure 201 may be a capacitive storage structure, a magnetic storage structure, a resistive storage structure, a ferroelectric storage structure or the like. A capacitor structure may be a trench capacitor, including structures such as an upper electrode plate, a lower electrode plate and a dielectric layer.

Figure 4:
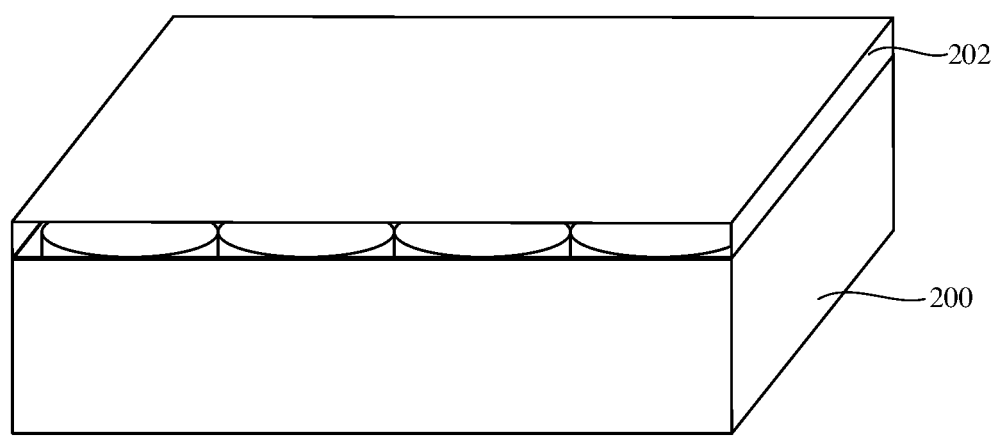
Figure 5:
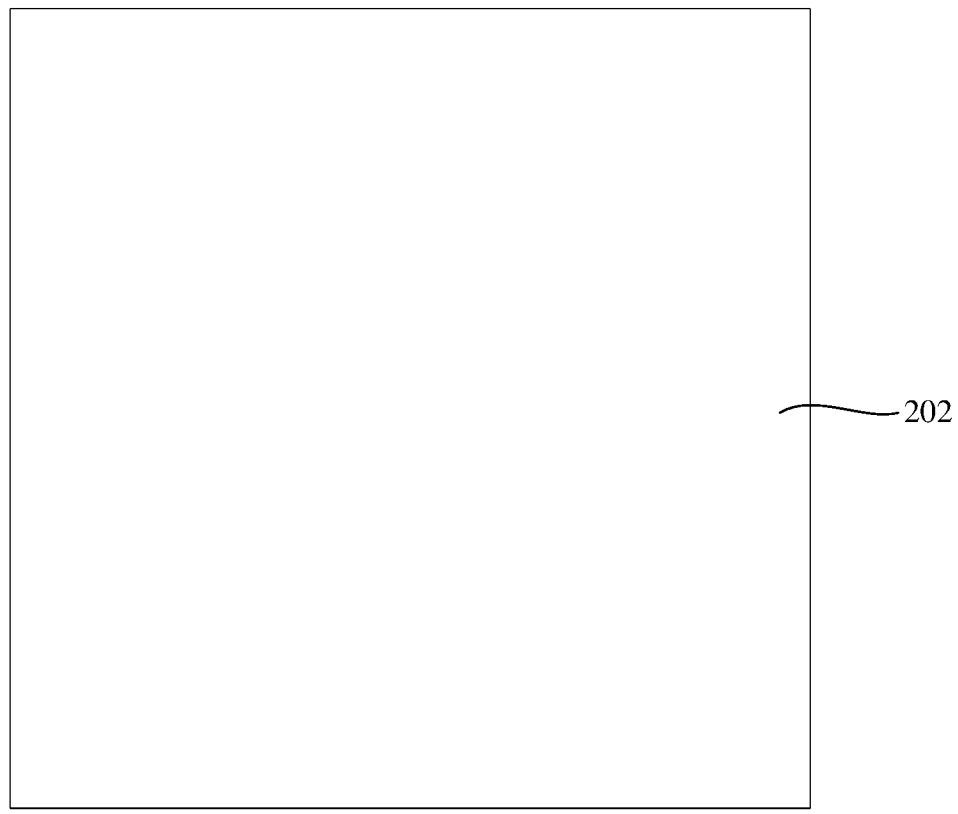
Figure 6:
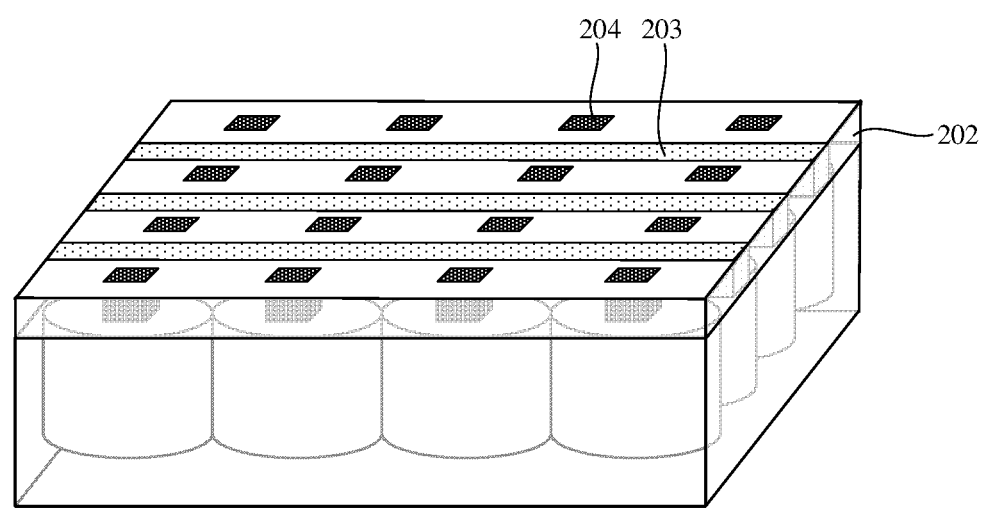
Figure 7:
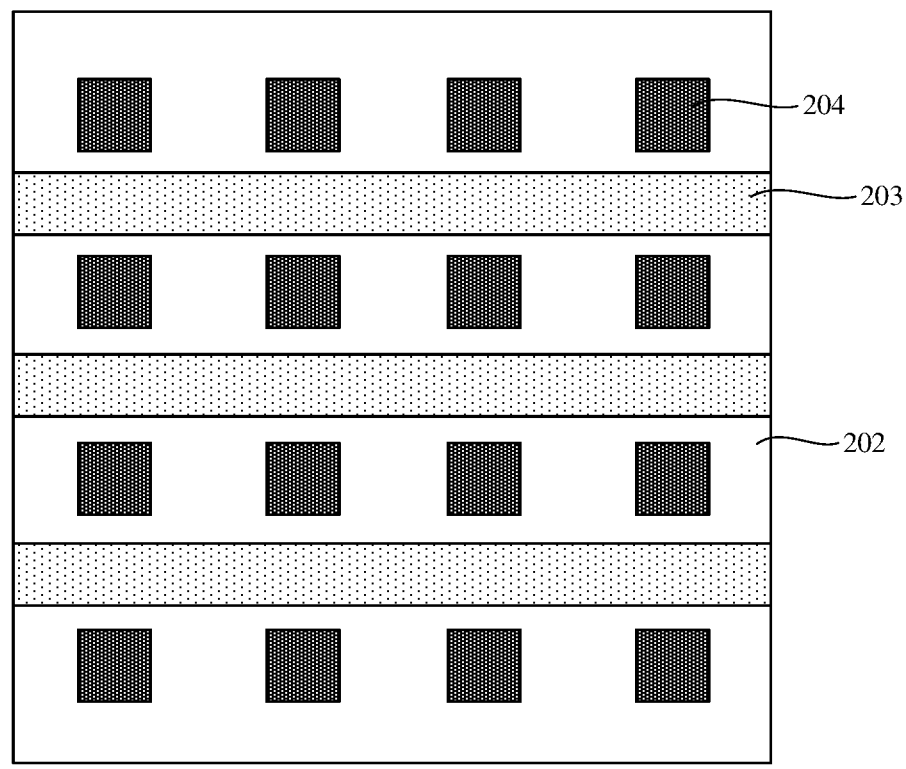

Referring to FIG. 4 to FIG. 7, FIG. 5 is a top view of the semiconductor structure of FIG. 4, and FIG. 7 is a top view of the semiconductor structure of FIG. 6. A second bitline 203 is formed on the first storage structure 201 (refer to FIG. 2 to FIG. 3). A first storage node contact 204 is formed on the first storage structure 201.

The step of forming a second bitline 203 includes: forming a second insulation layer 202 on the first storage structure 201, forming a second trench on the second insulation layer 202, and forming the second bitline 203 in the second trench.

For example, referring to FIG. 4 and FIG. 5, a layer of insulation material is deposited on the first storage structure 201 to form the second insulation layer 202.

In this embodiment, the second insulation layer 202 is formed by chemical vapor deposition or physical vapor deposition, which has a high deposition speed. In other embodiments, other deposition technologies may also be adopted. The second insulation layer 202 may be made of silicon dioxide, silicon nitride or silicon carbonitride.

Referring to FIG. 6 and FIG. 7, a second trench is formed on the second insulation layer 202, the second trench is filled, and the second bitline 203 is formed in the second trench.

The step of forming a first storage node contact 204 includes: forming a contact hole on the second insulation layer 202, and filling the contact hole with a conductive material such as polysilicon to form the first storage node contact 204. The first storage node contact 204 is electrically connected to the first storage structure 201.

For example, the first storage node contact 204 is located on a central axis of the first storage structure 201, the first storage node contacts 204 are arranged in an equally-spaced array, the second bitlines 203 are arranged in parallel with an equal spacing, and the second bitlines 203 and the first storage node contacts 204 are distributed alternately. Such an arrangement can increase the arrangement density of the storage structures and then increase the storage capacity.

Referring to FIG. 8 to FIG. 23, a transistor 209 (refer to FIG. 28) and a wordline 205 are formed on the second bitline 203 (refer to FIG. 6 to FIG. 7), and the transistor 209 includes a source 207, a drain 208 and a channel region (not shown in the drawing). The channel region is located between the source 207 and the drain 208, and the wordline 205 is connected to the channel region of the transistor 209 and configured to control ON and OFF of the transistor 209.

Figure 8:
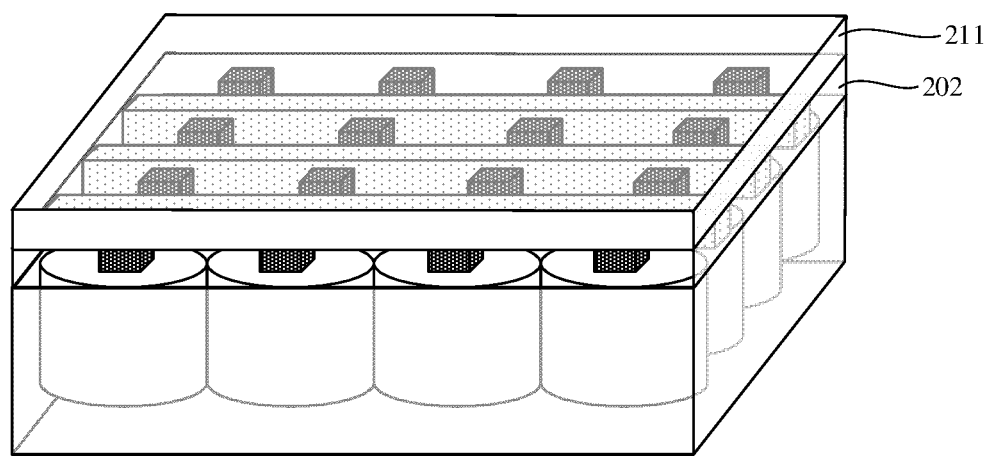
Figure 9:
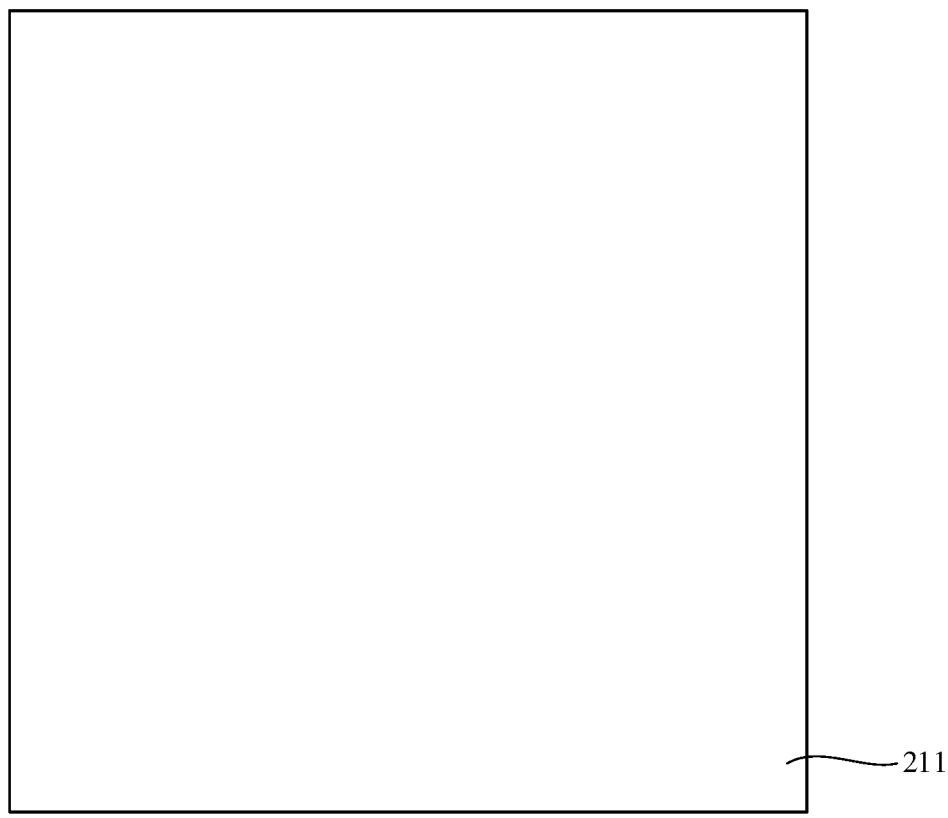

For example, referring to FIG. 8 and FIG. 9, FIG. 9 is a top view of the semiconductor structure of FIG. 8. A silicon layer 211 is formed on the second insulation layer 202.

Figure 10:
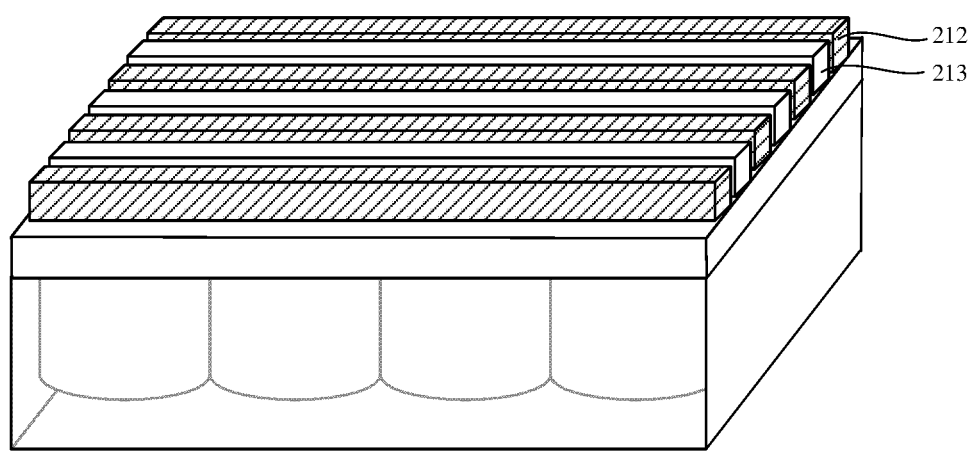
Figure 11:
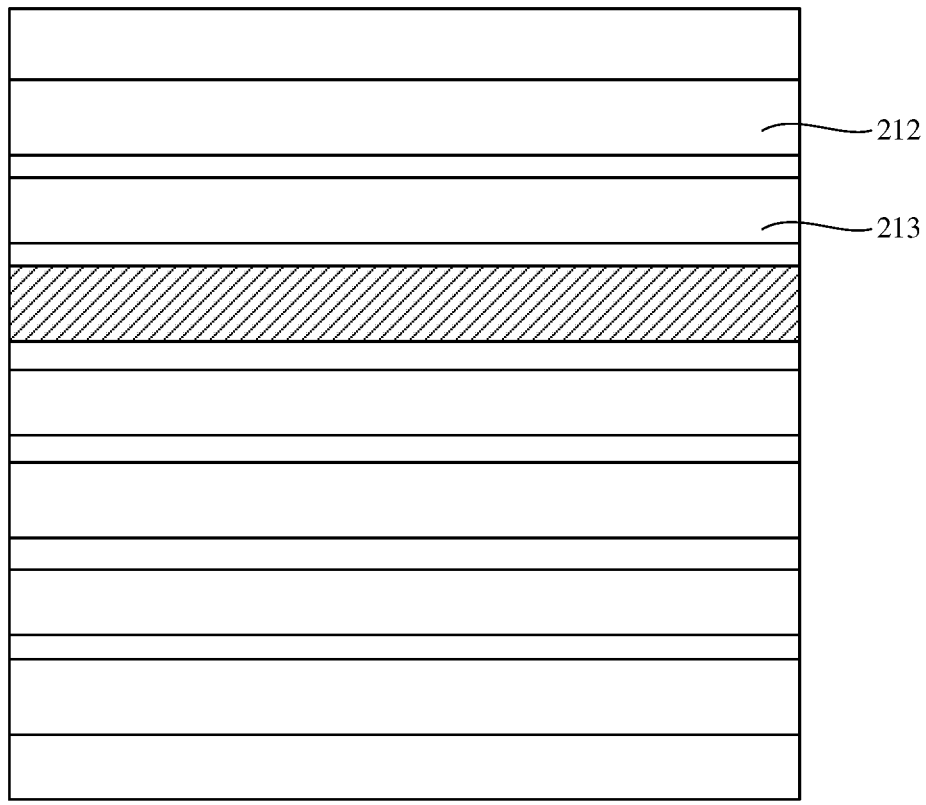

Referring to FIG. 10 and FIG. 11, FIG. 11 is a top view of the semiconductor structure of FIG. 10. A plurality of separate stripe structures are formed, and source and drain ion implantation is performed on the stripe structures to form initial source stripe structures 212 and initial drain stripe structures 213. The initial source stripe structures 212 and the initial drain stripe structures 213 are arranged alternately.

In this embodiment, source ions and drain ions are the same in variety and concentration. The initial source stripe structure 212 and the initial drain stripe structure 213 formed are N-type semiconductor structures or P-type semiconductor structures. The initial source stripe structure 212 is located above the first storage node contact 204, and the initial drain stripe structure 213 is located above the second bitline 203.

Figure 12:
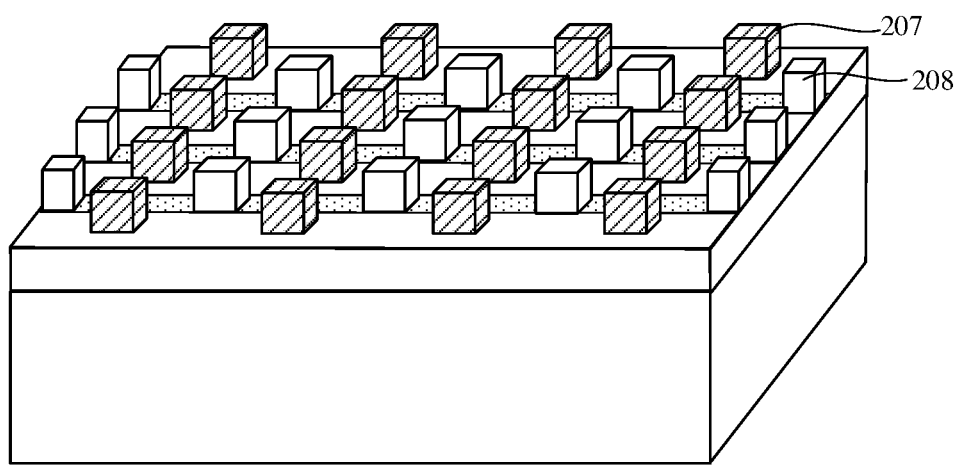
Figure 13:
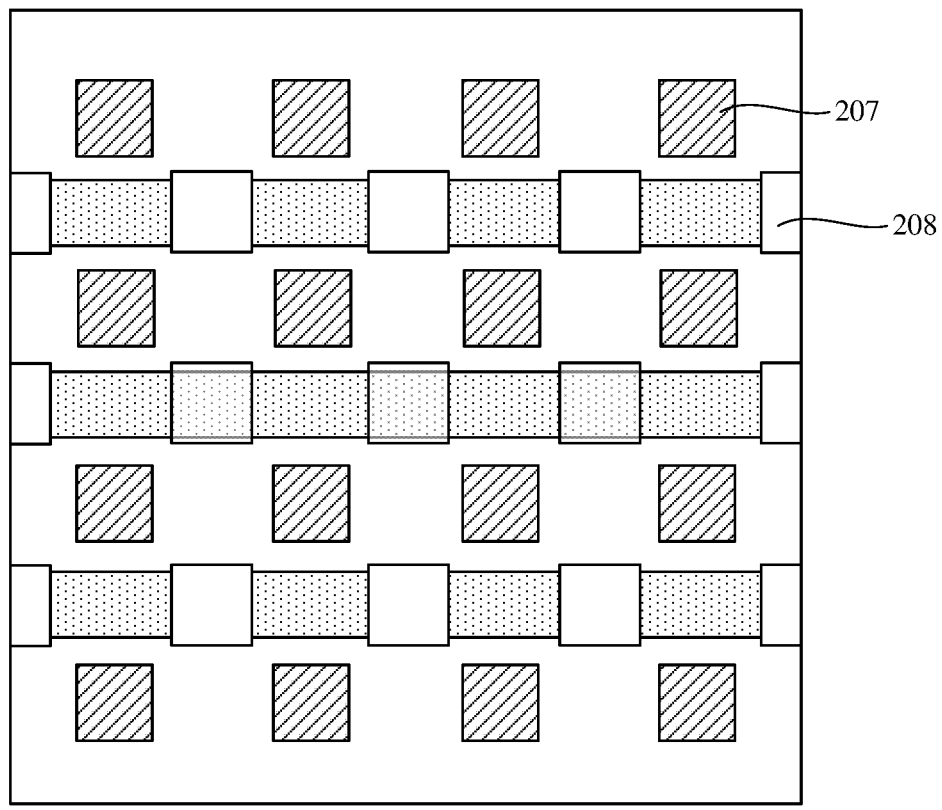

Referring to FIG. 12 and FIG. 13, FIG. 13 is a top view of the semiconductor structure of FIG. 12. The initial source stripe structure 212 and the initial drain stripe structure 213 are patterned to form the source 207 and the drain 208 of independent columnar structures.

In this embodiment, the source 207 at a lower end of the transistor 209 (refer to FIG. 28) is electrically connected to the first storage node contact 204 (refer to FIG. 6 to FIG. 7), and the drain 208 at a lower end of another transistor 209 is electrically connected to the second bitline 203 (refer to FIG. 6 to FIG. 7). In other embodiments, the source at the lower end of the transistor may also be electrically connected to the second bitline, and the drain at the lower end of another transistor may also be electrically connected to the first storage node contact.

Referring to FIG. 14 to FIG. 21, the step of forming a wordline 205 includes: forming a semiconductor pillar 214 on the source 207 (refer to FIG. 12 to FIG. 13) or the drain 208 (refer to FIG. 12 to FIG. 13) at one end of the transistor 209 (refer to FIG. 28); forming a gate dielectric layer 216 on a sidewall of the semiconductor pillar 214; and forming the wordline 205 on a periphery of the gate dielectric layer 216, the wordline 205 exposing a sidewall and a top at the other end of the semiconductor pillar 214.

Figure 14:
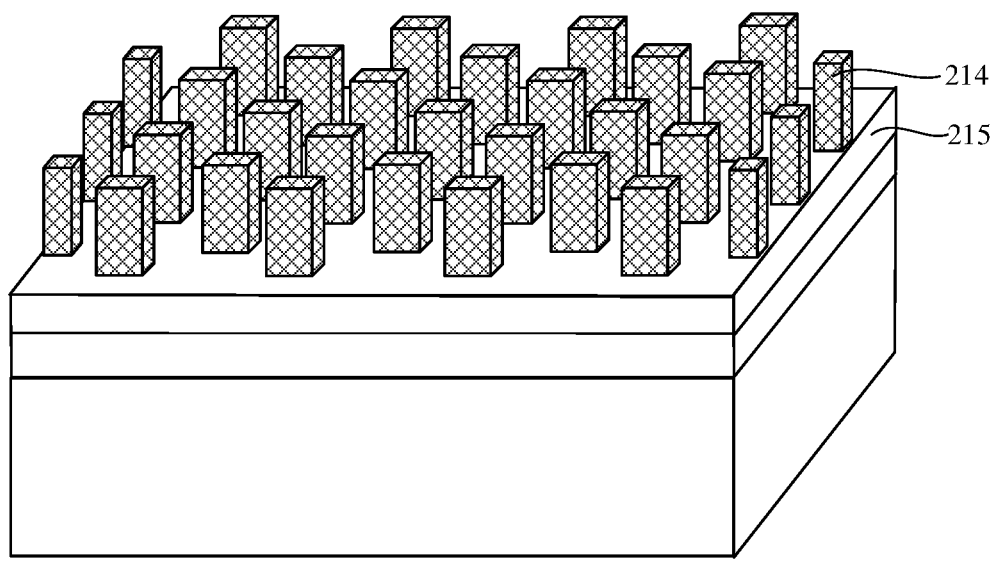
Figure 15:
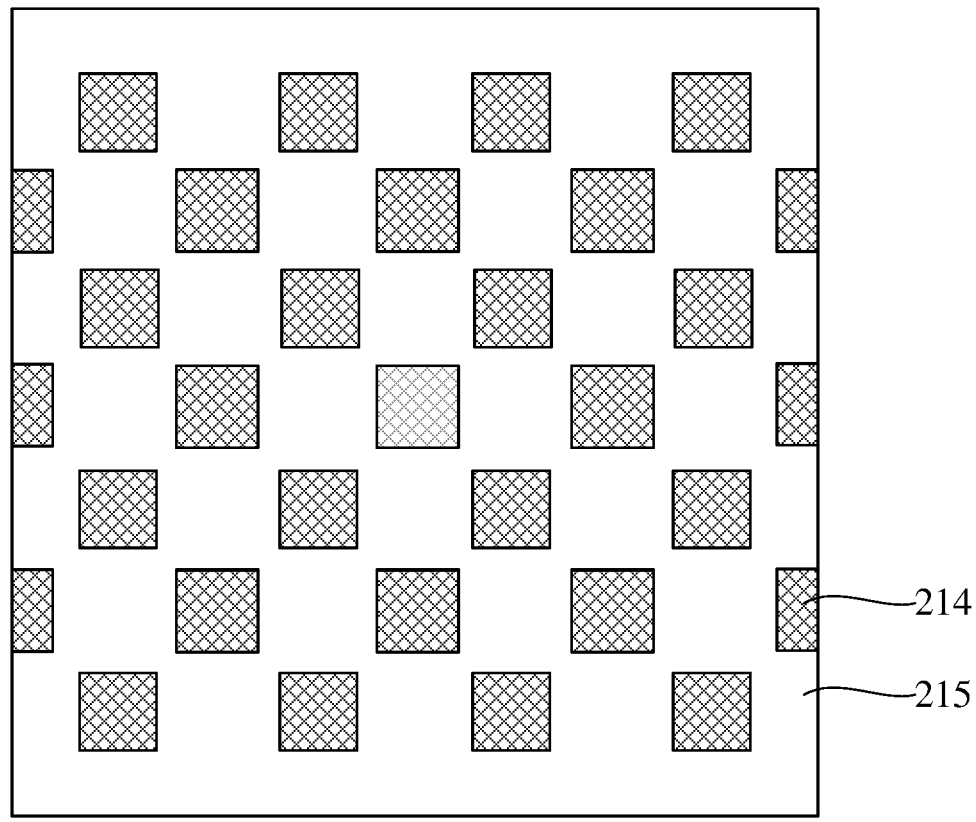

For example, referring to FIG. 14 and FIG. 15, FIG. 15 is a top view of the semiconductor structure of FIG. 14. A gap between the source 207 and the drain 208 is filled with an insulation material to form a third insulation layer 215. The third insulation layer 215 exposes tops of the source 207 and the drain 208. The semiconductor pillar 214 is formed on the source 207 and the drain 208.

The semiconductor pillar 214 is connected to the source 207 or the drain 208 at the lower end of the transistor 209.

In this embodiment, the semiconductor pillar 214 is made of silicon. In other embodiments, the semiconductor pillar may be made of germanium or other semiconductor materials.

In this embodiment, the step of forming a semiconductor pillar 214 includes: depositing a layer of semiconductor material on the third insulation layer 215, and patterning the semiconductor material to form the semiconductor pillar 214. In this way, the semiconductor pillar 214 is formed faster.

Figure 16:
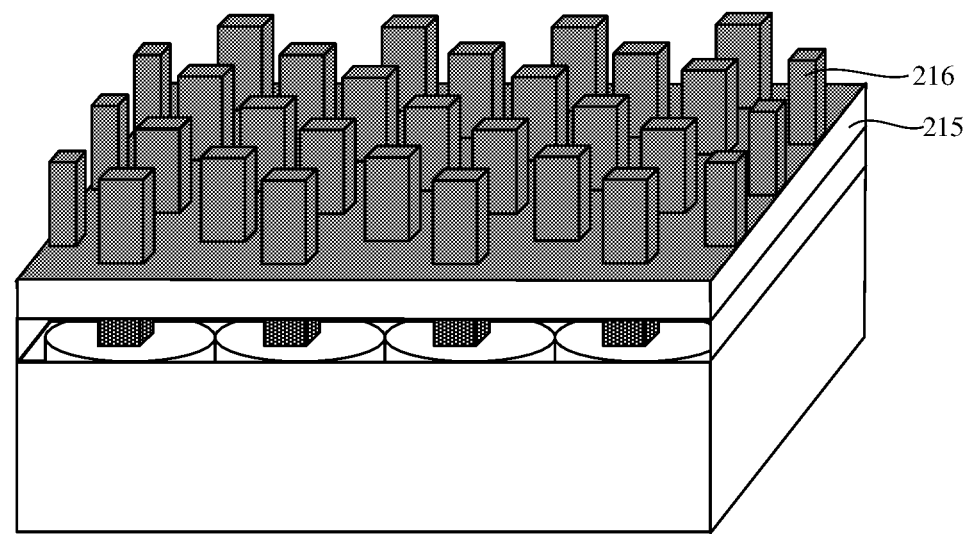
Figure 17:
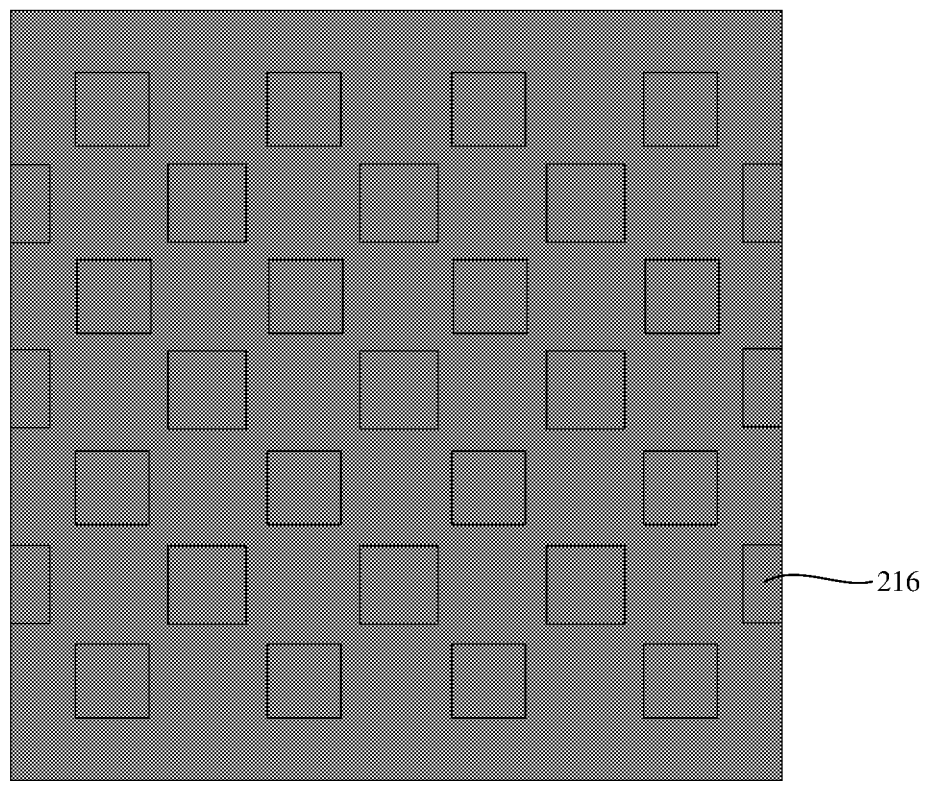

Referring to FIG. 16 and FIG. 17, FIG. 17 is a top view of the semiconductor structure in FIG. 16. A gate dielectric material is deposited on a sidewall and an upper surface of the semiconductor pillar 214 (refer to FIG. 14 to FIG. 15)

and an upper surface of the third insulation layer 215 to form the gate dielectric layer 216 covering the sidewall of the semiconductor pillar 214.

Figure 18:
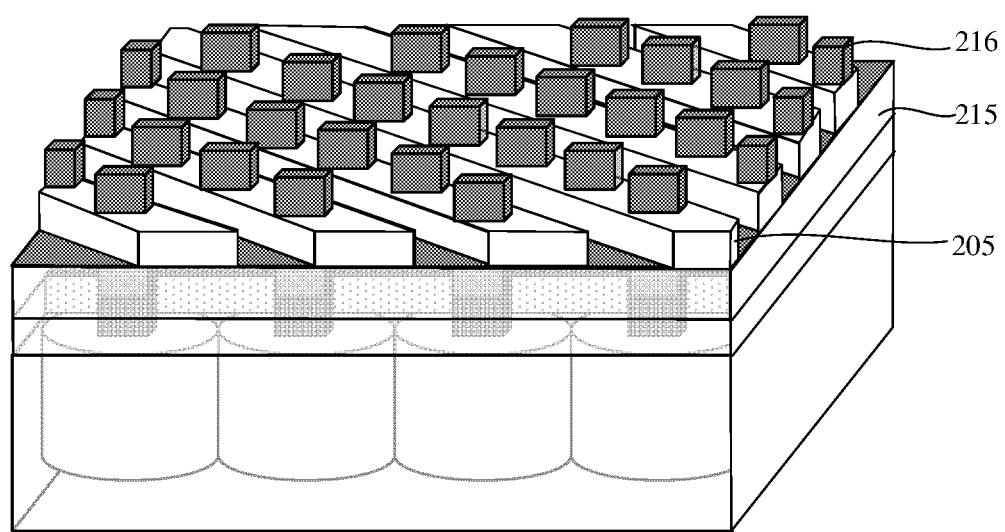
Figure 19:
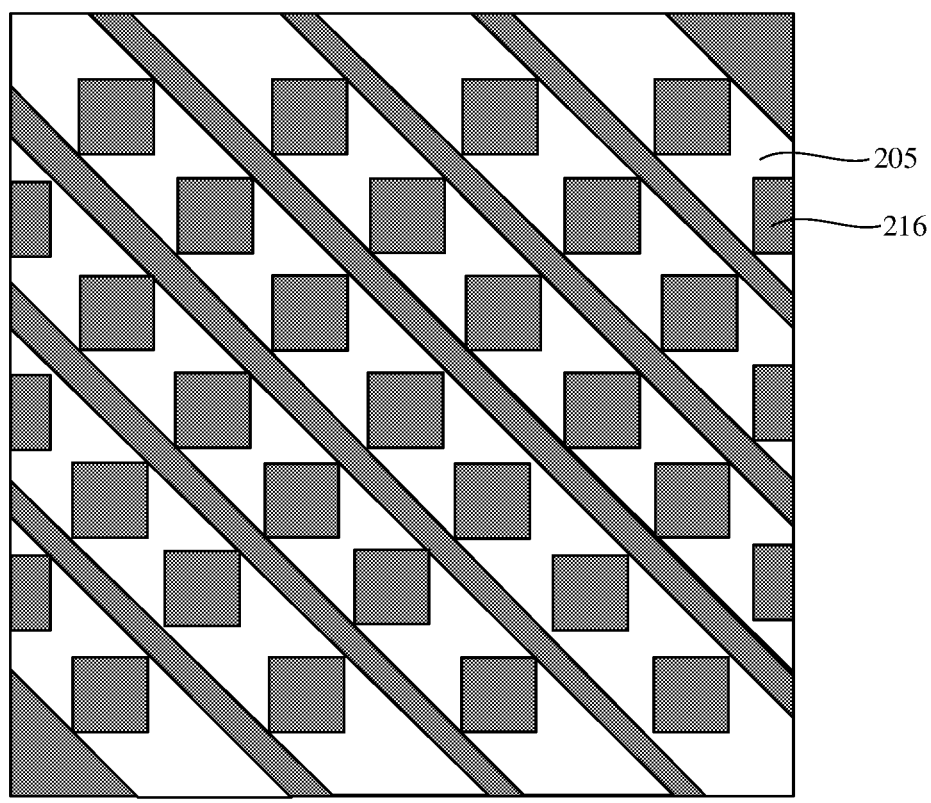

Referring to FIG. 18 and FIG. 19, FIG. 19 is a top view of the semiconductor structure in FIG. 18. A layer of gate material is formed on the third insulation layer 215, and the gate material is patterned to form separate wordlines 205. An extension direction of the wordline 205 and an extension direction of the second bitline 203 are at an acute or obtuse angle.

The wordline 205 covers only a part of the semiconductor pillar 214 (refer to FIG. 14 to FIG. 15), and exposes the gate dielectric material on a sidewall and a top at the other end of the semiconductor pillar 214.

Figure 20:
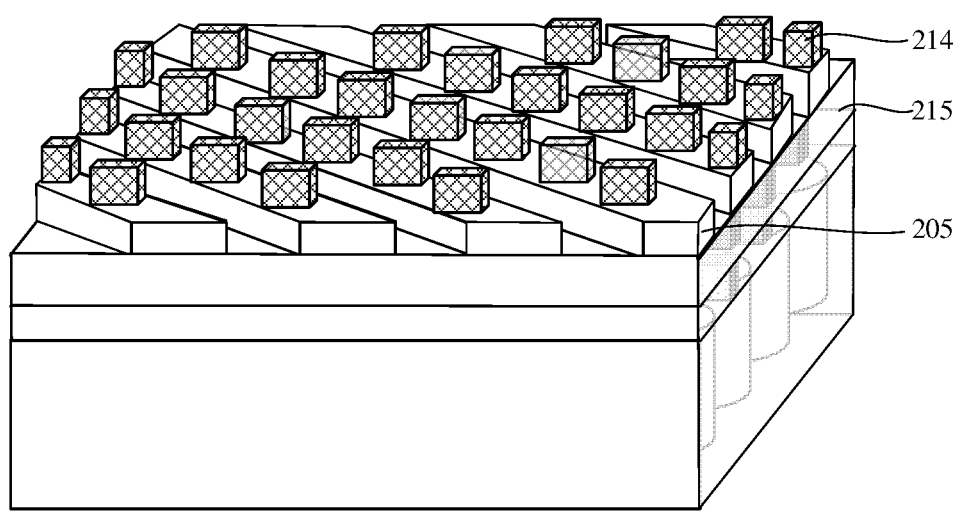
Figure 21:
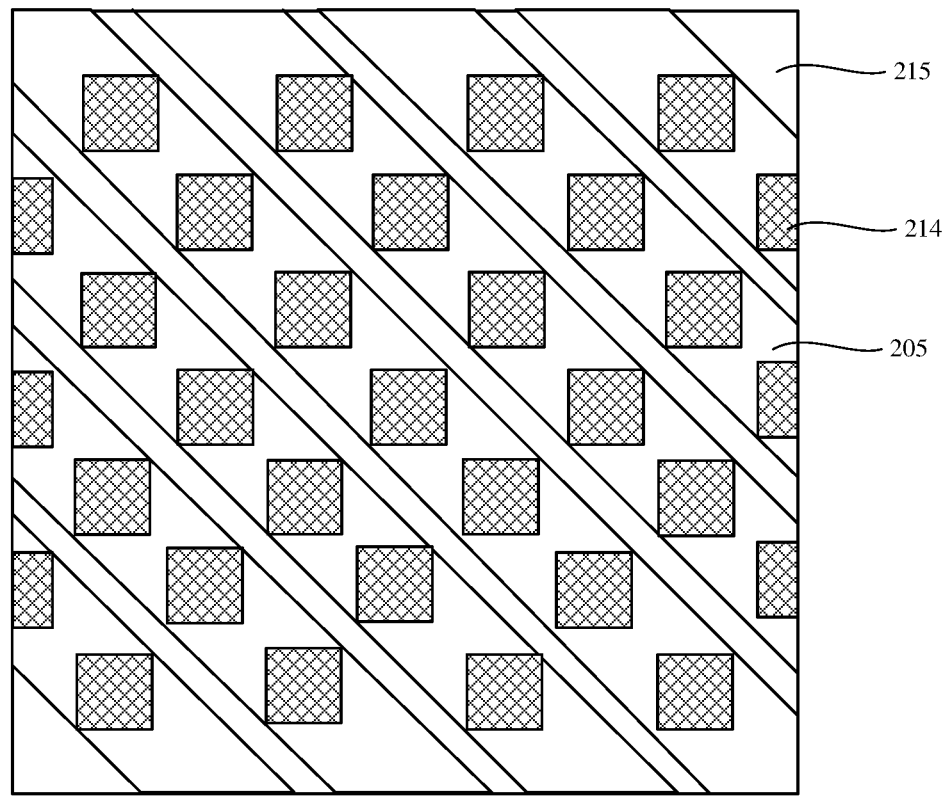

Referring to FIG. 20 and FIG. 21, FIG. 21 is a top view of the semiconductor structure of FIG. 20. The gate dielectric material on the upper surface of the third insulation layer 215 and the gate dielectric material exposed by the wordline 205 are removed to expose the semiconductor pillar 214 above the wordline.

Figure 22:
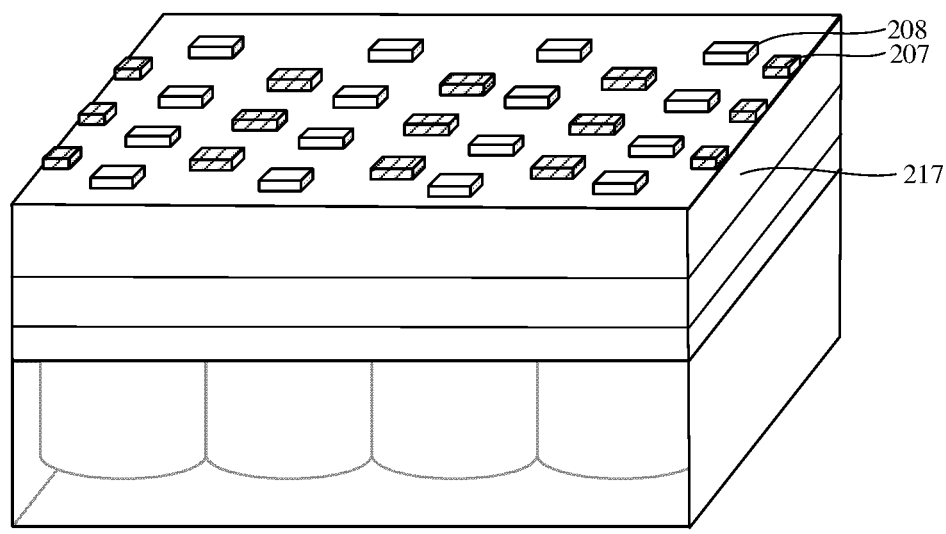
Figure 23:
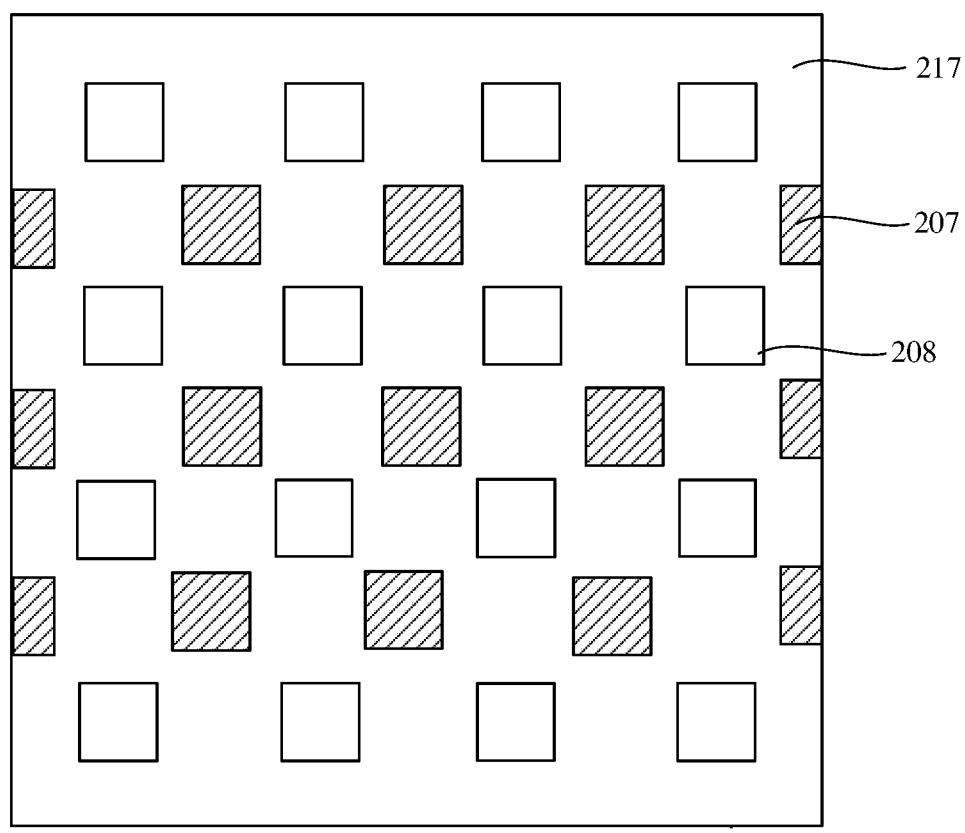

Referring to FIG. 22 and FIG. 23, FIG. 23 is a top view of the semiconductor structure of FIG. 22. The step of forming the source 207 or the drain 208 at the other end of the transistor 209 (refer to FIG. 28) includes: filling a gap between the wordline 205 and the semiconductor pillar 214 to form an isolation layer 217, the isolation layer 217 exposing the top of the semiconductor pillar 214 (refer to FIG. 20 to FIG. 21); and performing source and drain ion implantation on the exposed top of the semiconductor pillar 214 to form the source 207 or the drain 208 at the other end of the transistor 209 (refer to FIG. 28).

The isolation layer 217 is made of an insulation material such as silicon dioxide or silicon nitride.

In this embodiment, source ions and drain ions are the same in variety and concentration. In other embodiments, the source ions and the drain ions may also be different in variety and concentration.

Figure 24:
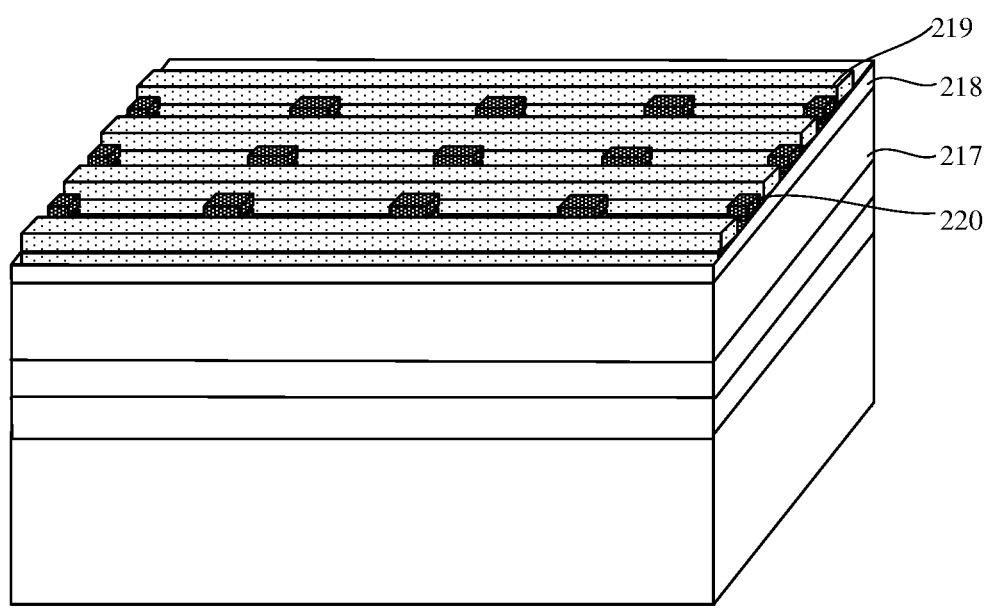
Figure 25:
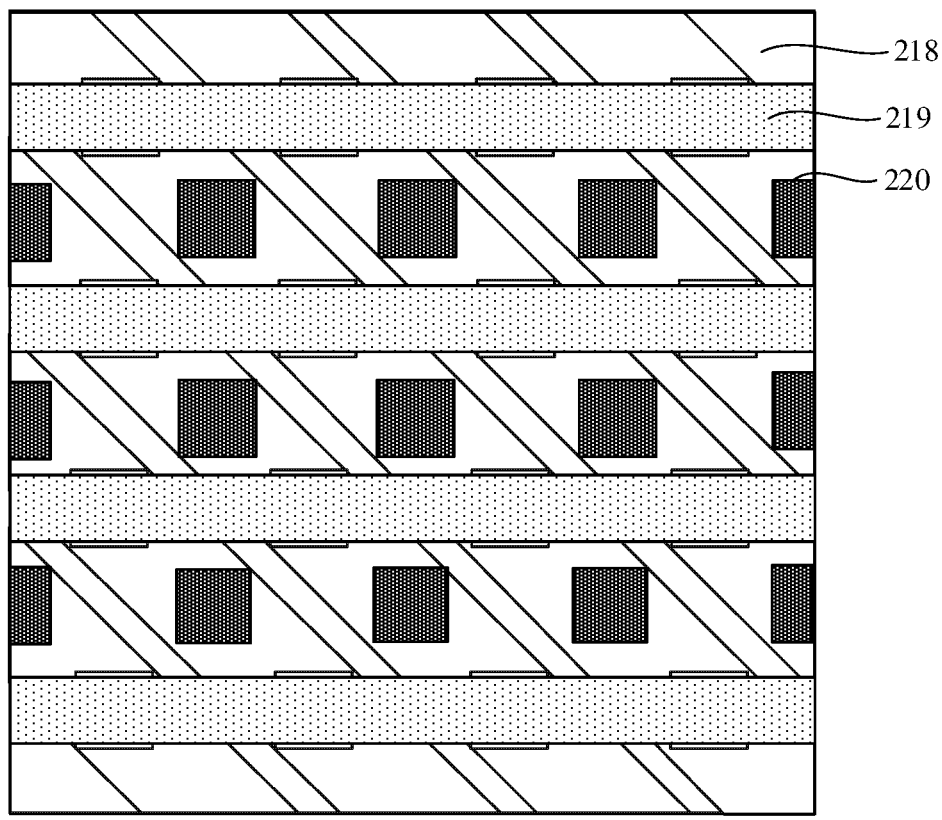

Referring to FIG. 24 and FIG. 25, FIG. 25 is a top view of the semiconductor structure of FIG. 24. A first bitline 219 is formed on the transistor 209 (refer to FIG. 28) and the wordline 205 (refer to FIG. 20 to FIG. 21). An extension direction of the wordline 205 and an extension direction of the first bitline 219 are at an acute or obtuse angle.

The step of forming a first bitline 219 includes: forming a first insulation layer 218 on the transistor 209 and the wordline 205, forming a first trench on the first insulation layer 218, and forming the first bitline 219 in the first trench.

In this embodiment, the first insulation layer 218 is formed by chemical vapor deposition or physical vapor deposition. In other embodiments, other deposition technologies may also be adopted.

The first trench is formed by etching, and the first trench is filled with a material to form the first bitline 219. In this embodiment, the first bitline 219 is partially located in the first trench and partially higher than the first trench. In other embodiments, the first bitline may also be wholly located in the first trench.

In this embodiment, the first bitline 219 is electrically connected to the drain 208 (refer to FIG. 22 to FIG. 23) at an upper end of the transistor 209. In other embodiments, the first bitline may also be electrically connected to the source at the upper end of the transistor.

A contact hole is formed on the first insulation layer 218, and a second storage node contact 220 is formed in the contact hole. In this embodiment, the second storage node contact 220 is partially located in the contact hole and partially higher than the contact hole. In other embodiments, the second storage node contact may also be wholly located in the contact hole.

The second storage node contact 220 is electrically connected to the source 207 (refer to 22 to FIG. 23) at an upper end of the transistor 209. In other embodiments, the second storage node contact may also be electrically connected to the drain at the upper end of the transistor.

Figure 26:
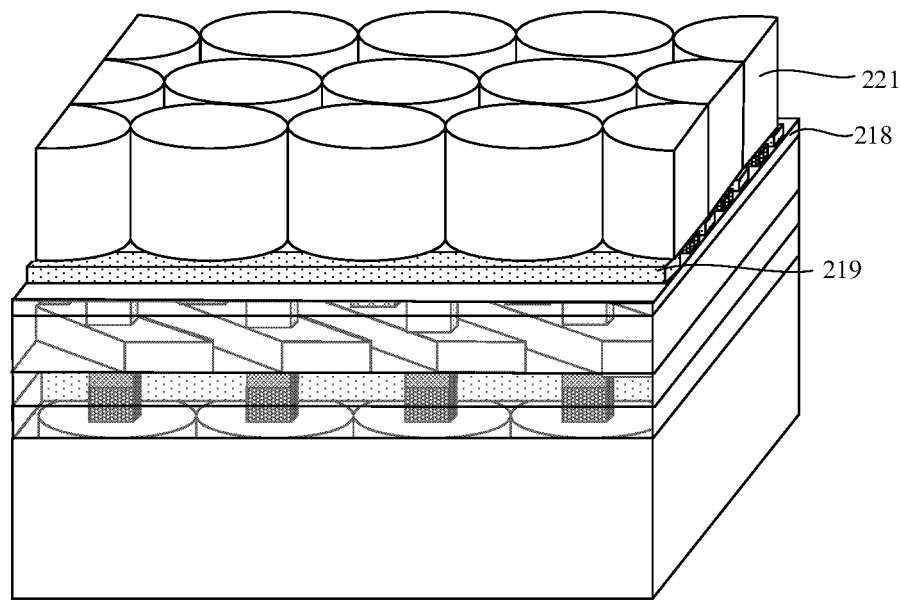
Figure 27:
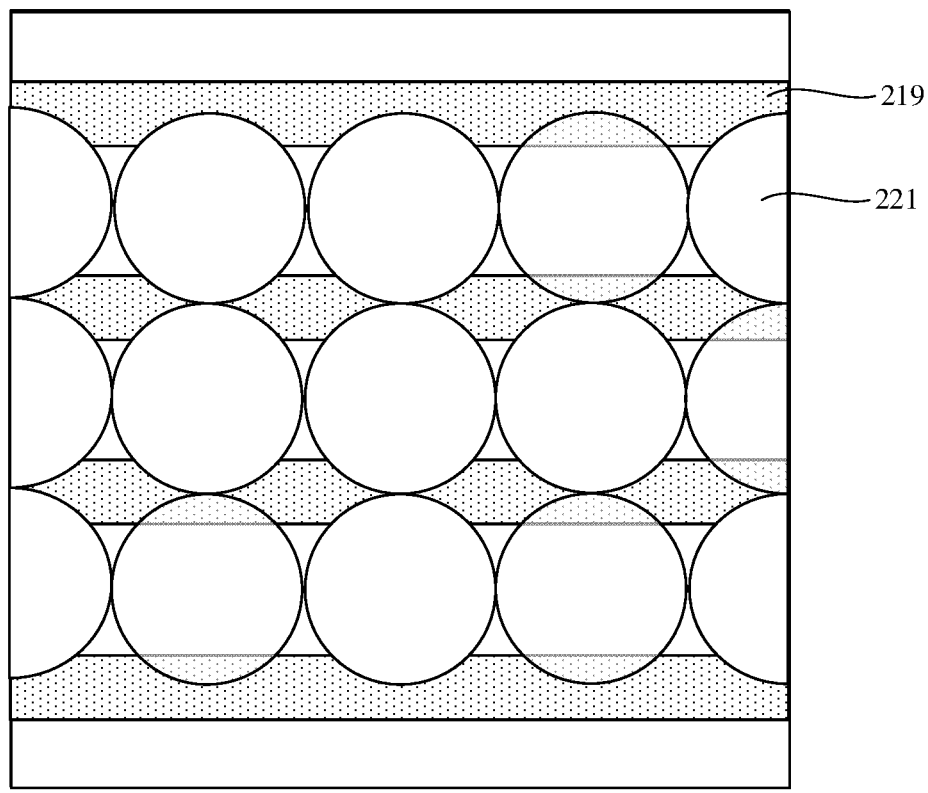

Referring to FIG. 26 and FIG. 27, FIG. 27 is a top view of the semiconductor structure of FIG. 26. A second storage structure 221 is formed on the first bitline 219.

Figure 28:
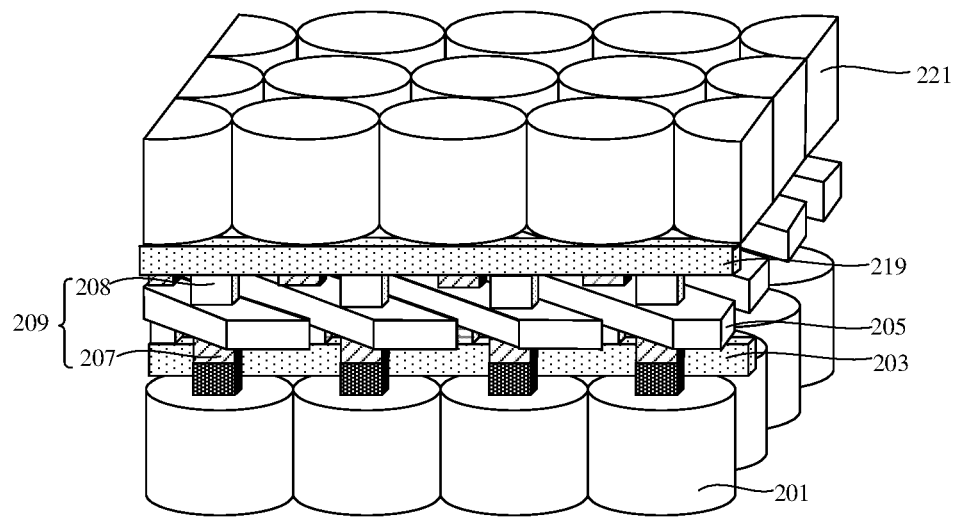

Referring to FIG. 28, FIG. 28 shows a semiconductor structure manufactured with a manufacturing method according to this embodiment. The first bitline 219 and the second bitline 203 are connected to the first storage structure 201 and the second storage structure 221 respectively through the transistor 209, and the first storage structure 201 and the second storage structure 221 are staggered. In this way, the internal space of the memory can be fully utilized, the storage capacity is increased, and then the performance of the memory is improved. In addition, an extension direction of the first bitline 219 and an extension direction of the second bitline 203 are the same, and the extension direction of the first bitline 219 and an extension direction of the wordline 205 are at an acute or obtuse angle. In this way, process difficulty can be simplified, and when a spacing between the wordlines 205 is fixed, spacings between the first storage structures 201 and between the second storage structures 221 are increased, thereby improving a process window and increasing a product yield.

Those of ordinary skill in the art may understand that the above implementations are specific embodiments for implementing the present disclosure. However, in practical disclosures, various changes in forms and details may be made thereto without departing from the spirit and scope of the present disclosure. Any person skilled in the art can make respective changes and modifications without departing from the spirit and scope of the present disclosure. Therefore, the protection scope of the present disclosure should be subject to the scope defined by the claims.

What is claimed is:

1. A semiconductor structure, comprising:
    a wordline; and
    a first bitline and a second bitline located on two sides of the wordline and a first storage structure and a second storage structure located on the two sides of the wordline, the first bitline and the second bitline being connected to the first storage structure and the second storage structure respectively through a pair of transistors;
    an extension direction of the first bitline and an extension direction of the wordline being at an acute or obtuse angle; and, wherein
    the transistors comprise a first transistor and a second transistor, two ends of the first transistor are connected to the first bitline and the first storage structure respectively, and two ends of the second transistor are connected to the second bitline and the second storage structure respectively; and
    in a cross-section the first bitline and the second storage structure are located on one side of the transistors, and the second bitline and the first storage structure are located on the other side of the transistors.

2. The semiconductor structure according to claim 1, wherein
    the transistors are a vertical transistors.

3. The semiconductor structure according to claim 1, wherein
adjacent transistors connected to a same wordline are connected to the first storage structure and the second storage structure respectively.

4. The semiconductor structure according to claim 1, wherein
the second bitline and the first storage structure are located on different layers;
the first bitline and the second storage structure are located on different layers;
and the second bitline is closer to one layer of the transistors than the first storage structure.

5. The semiconductor structure according to claim 1, wherein
a plurality of wordlines, a plurality of first bitlines, a plurality of second bitlines, a plurality of first storage structures and a plurality of second storage structures are provided;
the plurality of wordlines are located in a same layer, the plurality of first bitlines and the plurality of second storage structures are located on one side of the layer where the wordlines are located, and the plurality of second bitlines and the plurality of first storage structures are located on another side of the layer where the wordlines are located; the plurality of first bitlines are located in a same layer, the plurality of second storage structures are located in a same layer, the plurality of second bitlines are located in a same layer, and the plurality of first storage structures are located in a same layer.

6. The semiconductor structure according to claim 1, wherein
the transistors connected to the first storage structure and the transistors connected to the second storage structure are staggered with respect to the wordline.

7. The semiconductor structure according to claim 6, wherein
the transistors connected to the first storage structure are aligned, and the transistors connected to the second storage structure are aligned.

8. The semiconductor structure according to claim 1, further comprising:
a first storage node contact and a second storage node contact;
the first storage structure being connected to a source or a drain of the first transistor through the first storage node contact, and the second storage structure being connected to the source or the drain of the second transistor through the second storage node contact.

9. The semiconductor structure according to claim 8, wherein
the first storage node contact and the second bitline are located on a same layer, and the second storage node contact and the first bitline are located on a same layer.

10. The semiconductor structure according to claim 1, further comprising:
a first bitline node contact and a second bitline node contact;
the first bitline being connected to a source or a drain of the first transistor through the first bitline node contact, and the second bitline being connected to the source or the drain of the second transistor through the second bitline node contact.

11. The semiconductor structure according to claim 1, wherein the extension direction of the first bitline is the same as that of the second bitline.

12. The semiconductor structure according to claim 1, wherein
the extension direction of the first bitline and the extension direction of the second bitline are respectively 60 degrees to an extension direction of the wordline.

* * * * *